(12) United States Patent
Goodman

(10) Patent No.: US 7,910,838 B2
(45) Date of Patent: Mar. 22, 2011

(54) SOLDER BALL INTERFACE

(75) Inventor: Glenn Goodman, Cumberland, RI (US)

(73) Assignee: Advanced Interconnections Corp., West Warwick, RI (US)

( * ) Notice: Subject to any disclaimer, the term of this patent is extended or adjusted under 35 U.S.C. 154(b) by 484 days.

(21) Appl. No.: 12/062,196

(22) Filed: Apr. 3, 2008

(65) Prior Publication Data

US 2009/0251874 A1    Oct. 8, 2009

(51) Int. Cl.
*H05K 1/11* (2006.01)
(52) U.S. Cl. ........ 174/263; 174/260; 174/261; 361/760; 361/767; 361/783; 361/790
(58) Field of Classification Search ............ 361/760, 361/751, 764, 767, 820, 808, 729, 736, 743, 361/748, 772, 773, 774, 790–792, 783; 174/260, 174/261, 262, 263, 255; 257/686, 779, 713, 257/780–782, 737, 738, 784, 786; 438/106, 438/612; 29/850, 852, 843, 830–832
See application file for complete search history.

(56) References Cited

U.S. PATENT DOCUMENTS

| | | | |
|---|---|---|---|
| 5,001,542 A | 3/1991 | Tsukagoshi et al. | |
| 5,846,366 A * | 12/1998 | Jin et al. ................ | 156/233 |
| 5,851,911 A | 12/1998 | Farnworth | |
| 5,955,784 A | 9/1999 | Chiu | |
| 5,986,460 A | 11/1999 | Kawakami | |
| 6,325,280 B1 | 12/2001 | Murphy | |
| 6,396,136 B2 | 5/2002 | Kalidas et al. | |
| 6,787,924 B2 | 9/2004 | Tsenemasu | |
| 6,812,580 B1 | 11/2004 | Wenzel et al. | |
| 2004/0238211 A1 * | 12/2004 | Momokawa et al. ......... | 174/260 |
| 2006/0055040 A1 * | 3/2006 | Brooks et al. ................ | 257/738 |
| 2006/0145313 A1 | 7/2006 | Lee | |
| 2007/0254408 A1 * | 11/2007 | Caletka et al. ............... | 438/122 |

* cited by examiner

*Primary Examiner* — Dameon E Levi
*Assistant Examiner* — Hoa C Nguyen
(74) *Attorney, Agent, or Firm* — Occhiuti Rohlicek & Tsao LLP

(57) ABSTRACT

An intercoupling component is provided that electrically connects the device leads of an integrated circuit package to a substrate. The package includes external device leads, each device lead having a downwardly extending section proximate a side of the package body, and the intercoupling component includes an insulating support member. The support member includes a first surface including first electrical attachment sites, each configured for making an electrical connection with a corresponding one of the device leads of the package. The support member also includes an opposite second surface including second electrical attachment sites in electrical contact with the first electrical attachment sites, each of the second electrical attachment sites including a plurality of solder balls associated with each device lead. The plurality of solder balls are used to form an electrical connection between each surface mount pad on the substrate and the corresponding conductive pad of the intercoupling component.

15 Claims, 5 Drawing Sheets

US 7,910,838 B2

SOLDER BALL INTERFACE

FIELD OF THE INVENTION

This invention relates to making connections between integrated circuit packages (e.g., quad-flat packages) and printed circuit boards, and more particularly to intercoupling components for making such connections.

BACKGROUND

Quad flat packages (QFPs) are popular in applications where packages are required to be manufactured in high volumes and at low costs. In general, a QFP is a surface-mounted integrated circuit package having leads extending from each of the four sides. The leads that extend from the QFP are generally soldered directly to corresponding surface mount pads of a printed circuit board.

However, there are several circumstances in which it may be advantageous to be able to indirectly connect a QFP to a circuit board using an intermediate intercoupling device. In one example, such an intercoupling device can serve as a converter in cases where there is a mismatch in size between the QFP and contacts of the printed circuit board. This can occur when advances in size reduction of one component, for example the printed circuit board, outpaces that of the other component, for example the QFP. In another example, in certain applications, a QFP may have manufacturing temperature requirements which differ from that of the printed circuit board. Use of an intercoupling device permits the QFP to be manufactured and assembled independently of the printed circuit board, and then connected to the printed circuit board subsequent to the manufacture.

Recent regulatory efforts to limit certain hazardous substances in some geographic areas and/or in some industries, such as the Restriction of Hazardous Substances in Electrical and Electronic Equipment (RoHS), have resulted in inconsistencies in the products that are manufactured, such that some electronic components, including QFPs and/or printed circuit boards, are compliant with regulations and some are not. Thus, it can be advantageous to provide an intercoupling device which permits, for example, a lead-free component to be assembled to a lead-containing component.

SUMMARY

This invention relates to making connections between integrated circuit packages (e.g., quad-flat packages) and circuit boards, and more particularly to intercoupling components for making such connections.

In some aspects, an intercoupling component of the type used to electrically connect the device leads of an integrated circuit package to a substrate is provided. The package includes a body and device leads, each device lead having a downwardly extending section proximate a side of the body, and the intercoupling component includes an insulating support member. The insulating support member includes a first surface including first electrical attachment sites, each configured for making an electrical connection with a corresponding one of the device leads of the integrated circuit package. The insulating support member also includes an opposite second surface including second electrical attachment sites in electrical contact with the first electrical attachment sites, each of the second electrical attachment sites including a plurality of solder balls associated with each device lead.

Embodiments can include one or more of the following.

The integrated circuit package can be a quad flat pack type package. The first electrical attachment sites can be electrically connected to the second electrical attachment sites by via holes. The plurality of solder balls can include at least three solder balls. Each of the plurality of solder balls can have a diameter of at most about 0.014 inches. The plurality of solder balls can include at least three solder balls arranged in a linear arrangement having approximately the same shape of the shape of as device leads of an integrated circuit package.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 3A is a detail view of a portion of FIG. 3 corresponding to dashed-line circle 3A.

DETAILED DESCRIPTION

Figure 1:
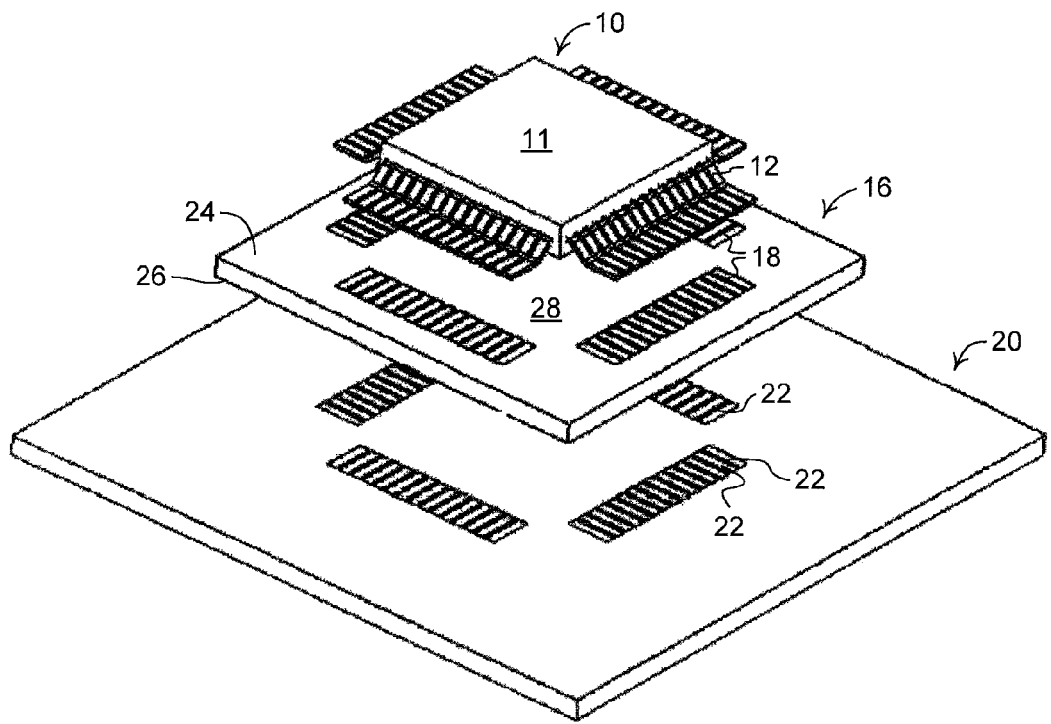
FIG. 1 is an exploded perspective view of an assembly in which an intercoupling component is used to electrically couple a QFP package to a printed circuit board.

Referring to FIG. 1, an intercoupling component 16 for electrically connecting the device leads 12 of an integrated circuit package such as a quad flat package 10 to a printed circuit board 20 is shown. The quad flat package 10 includes a body portion 11 with downwardly extending conductive leads 12 proximate to one or more sides of the body 11. The leads 12 are connected at one end to the body portion 11, and at another end have a portion bent to form elongate feet 14 that are substantially parallel to the body 11. When mounted to the intercoupling component 16, the feet 14 are in electrical contact with, and are fixed to, corresponding electrically conductive pads 18 formed on the surface of the intercoupling component 16 using conventional surface mount technology.

The intercoupling component 16 electrically connects the QFP 10 to the printed circuit board 20 and includes an electrically insulative member 28 having an upper surface 24 and a lower surface 26. The terms "upper" and "lower" are used here and throughout this document for descriptive purposes rather than to imply any absolute relative orientation.

Figure 3:
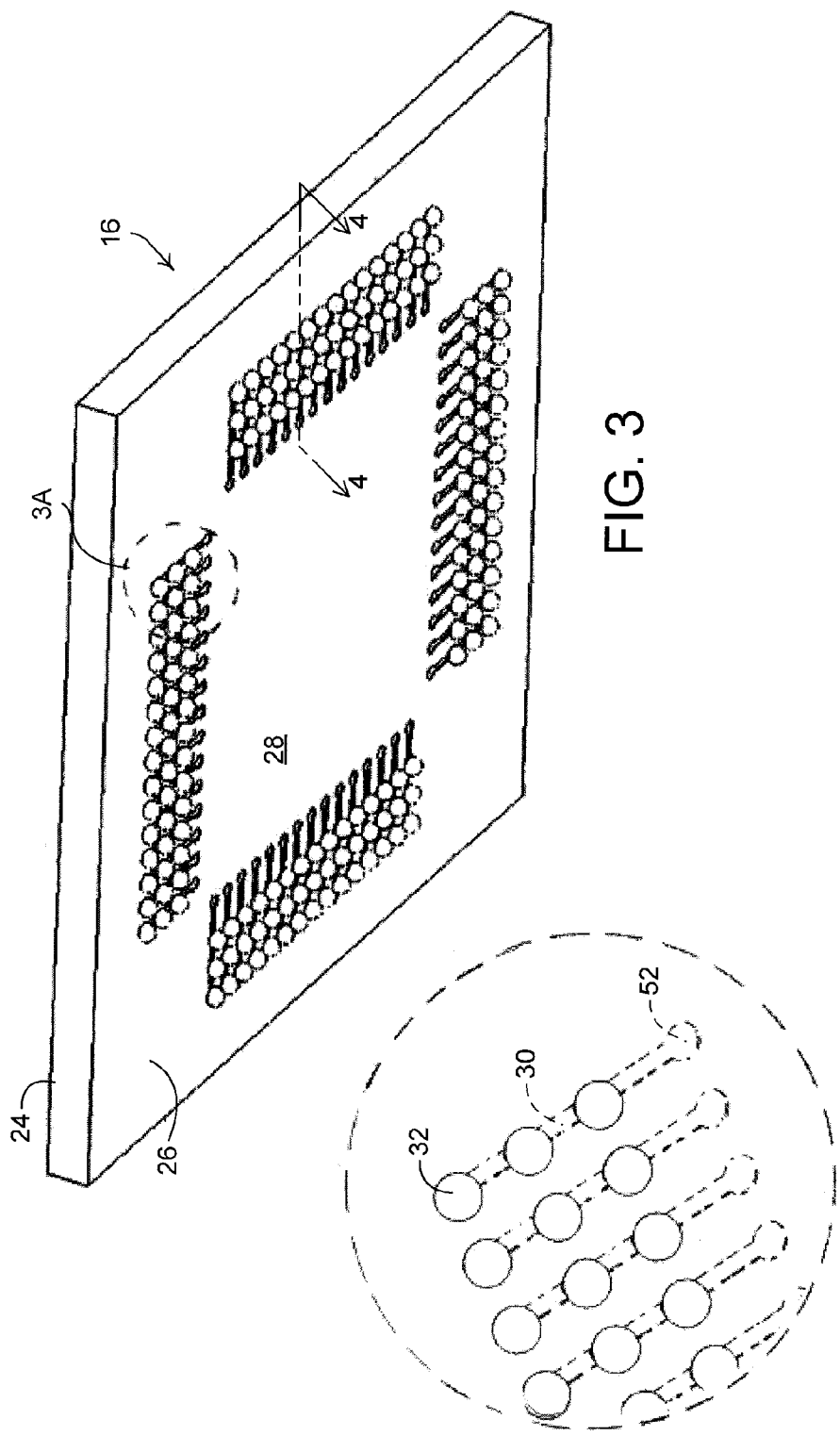
FIG. 3 is a perspective view of a lower surface of the intercoupling component of FIG. 1.

The upper surface 24 supports conductive pads 18 that are provided in a pattern corresponding to a footprint of the feet 14 of the QFP 10. In addition, each conductive pad 18 is formed having a size and shape corresponding to the size and shape of the feet 14 of leads 12. The lower surface 26 of the intercoupling component 16 (as shown in FIG. 3) supports electrical traces 30 that are provided in a pattern generally corresponding to a footprint of surface mount pads 22 of the printed circuit board 20.

Each upper conductive pad 18 terminates at one end in an electrical trace 40. Each trace 30 provided on the lower surface 26 of the intercoupling component 16 is electrically connected to the corresponding trace 40 of a conductive pad 18 on the upper surface 24 by an electrically conductive via 52

Figure 4:
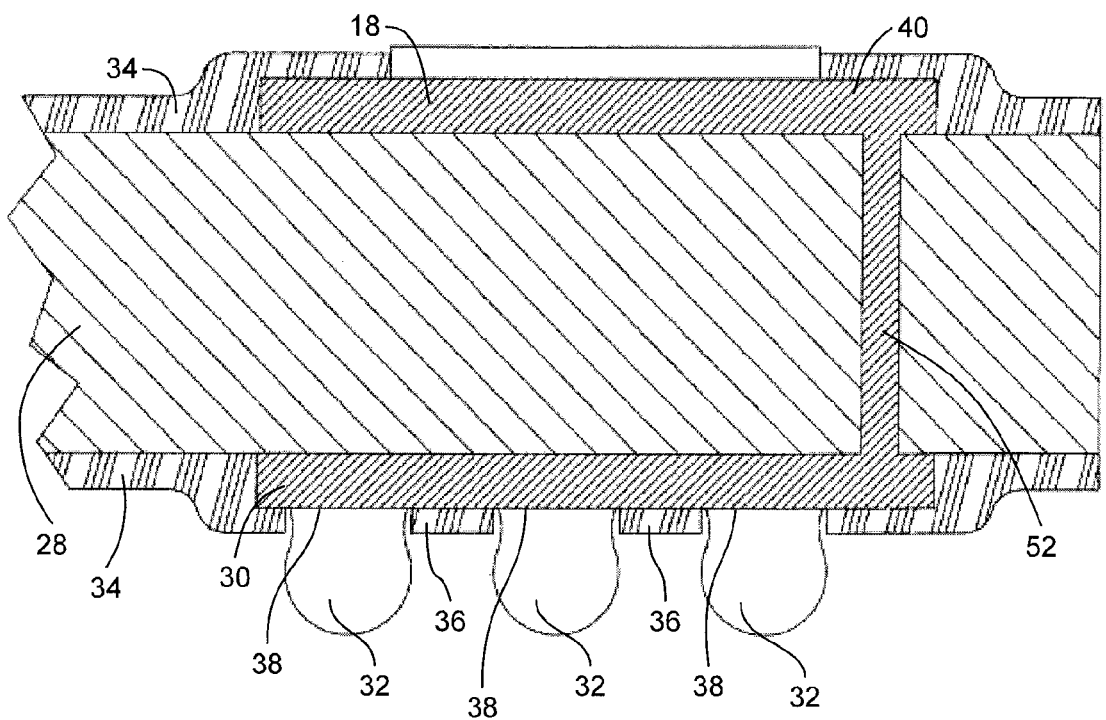
FIG. 4 is a cross-sectional view of a portion of FIG. 3 as seen along line 4-4.

(FIG. 4). The via 52 extends from the upper surface 24 to the lower surface 26, and forms an electrical current path through the intercoupling component 16 between the conductive pad 18 and the corresponding trace 30.

The upper and lower surfaces 24, 26 of the intercoupling component 16 are provided with a polymer solder resist coating 34. The coating 34 serves to prevent solder from bridging between conductors and thereby creating short circuits. The coating 34 also provides some protection for the intercoupling component 16 from the environment. As seen in FIG. 4, at locations corresponding to each conductive pad 18, the coating 34 is absent so that an electrical connection can be made between a lead 12 and the associated conductive pad 18. In some embodiments, the coating 34 overlies the traces 40 extending from each conductive pad, as well as terminal ends of the via 52. At locations corresponding to each trace 30, the coating 34 masks some portions 36 of the trace 30, while being absent from other portions 38. More specifically, at the trace 30, the solder resist coating 34 is configured to masks portions 36 of the trace 30, leaving exposed portions 38 sized and shaped to permit connection to the solder balls 32. In some embodiments, the trace 30 is widened in the vicinity of portions 38. In these embodiments, the trace 30 may be provided with generally circular widened portions to facilitate receipt of, and contact with, a solder ball 32.

Figure 2:
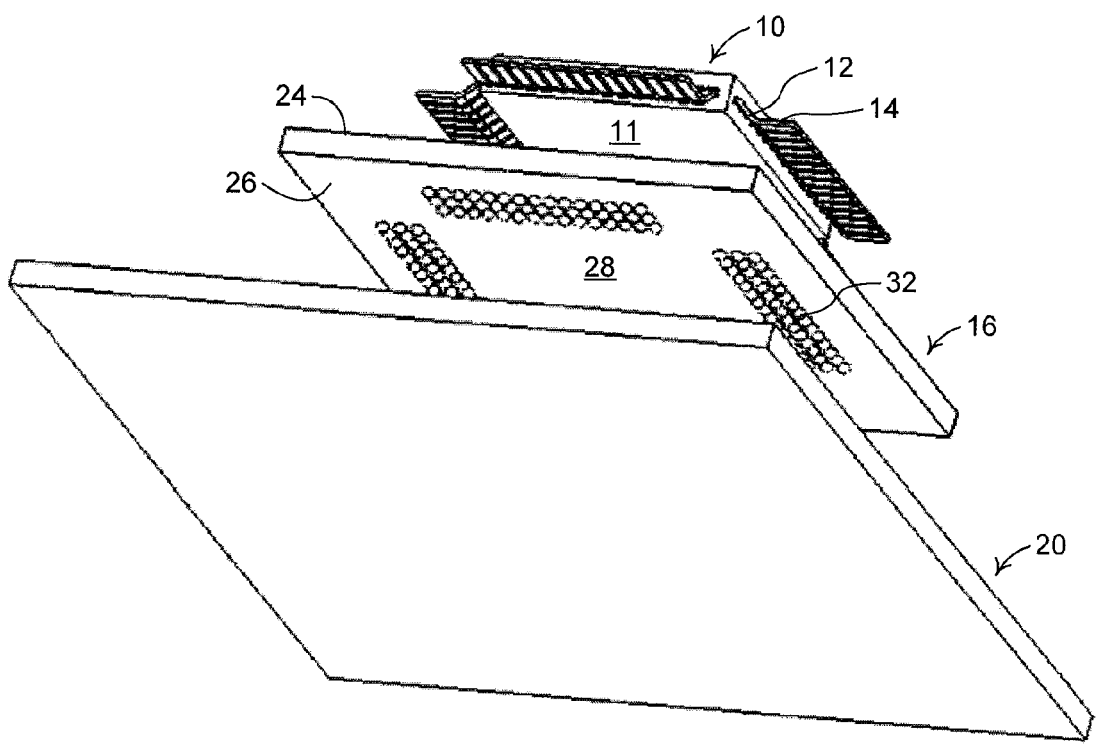
FIG. 2 is the exploded perspective view of FIG. 1 as seen from below.

As shown in FIGS. 2 and 3, the intercoupling component 16 further includes multiple rounded solder balls 32 attached to each of the traces 30 provided on the lower surface 26 of the intercoupling component 16. For each trace 30, the solder balls 32 are disposed in a preconfigured arrangement that corresponds to the shape of the surface mount pads 22 of circuit board 20, which in turn corresponds to a pattern of the leads of the QFP package 10. As a result, multiple solder balls 32 are used to form an electrical connection between a single surface mount pad 22 on the printed circuit board 20 and the corresponding trace 30.

The number and arrangement of the solder balls 32 can vary based on the size, shape, and arrangement of the leads 12 of the QFP 10, which determines the corresponding size, shape and arrangement of surface mount pads 22 of the printed circuit board 20. For example, as shown in FIGS. 2 and 3, each lead 12 of the QFP 10 is associated with a set of three solder balls 32 arranged in a line along the trace 30. As discussed above, the solder resist coating 34 masks portions 36 of the trace 30 between the solder balls 32, such that each solder ball 32 is fixed to a corresponding exposed portion 38 of the trace 30 (FIG. 4).

Figure 5:
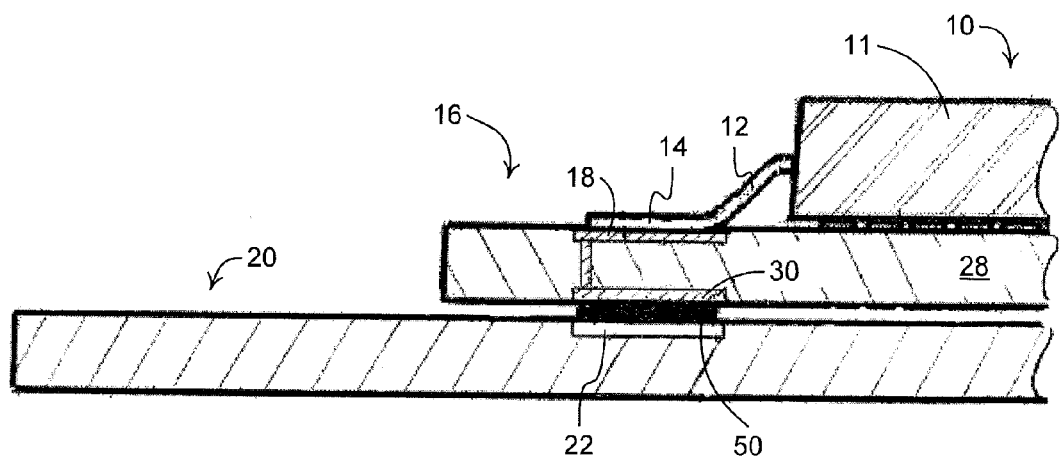
FIG. 5 is a cross sectional view of a portion of the assembly of FIG. 1 subsequent to soldering of the intercoupling component to the printed circuit board.

In order to electrically and mechanically connect the intercoupling component 16 to the printed circuit board 20, the solder balls 32 are soldered to corresponding surface mount pads 22 of the printed circuit board 20. As shown in FIGS. 3 and 4, during use, the arrangement of the solder balls 32 is configured to control fluid flow (e.g., the flow of molten solder) and prevent the occurrence of a short circuit between two adjacent surface mount pads 22 of printed circuit board 20, while substantially covering the entire surface mount pad 22. FIG. 4 shows a cross-sectional view of the intercoupling component 16 prior to being affixed to the circuit board 20. After the intercoupling component 16 has been affixed to the printed circuit board 20 by application of heat to cause the solder to flow, the solder forms a connection region 50 that is similar in shape to the shape of the leads 12 of the QFP 10, as seen in FIG. 5.

The use of multiple solder balls arranged in the shape of the lead 12 of a QFP 10, can provide various advantages in connecting the intercoupling component 16 to the printed circuit board 20. For example, the leads 12 of a QFP 10 are often closely spaced to one another. As such, the use of a single, larger solder ball to provide an electrical connection between the intercoupling component 16 and the printed circuit board 20 can result in solder flowing into regions where the solder may form an electrical connection with solder from an adjacent connection region resulting in a short between two leads of the QFP 10. The use of multiple, smaller solder balls arranged in a preconfigured layout can limit the flow of solder outside of the connection regions 22, limiting the likelihood of formation of electrical shorts between adjacent leads of the QFP 10.

The size of the solder balls 32 can be selected to control the flow of solder. For example, the solder balls may have a smaller diameter than a typical solder ball used to connect two electrical components. More particularly, in some embodiments, each of the solder balls 32 can have a diameter in the range of about 0.012 inches to about 0.014 inches (e.g., at most about 0.014 inches). The size and arrangement of the solder balls 32 can be selected such that after causing the solder to flow the shape of the solder generally matches the shape of the lead 12 of the QFP 10.

The use of multiple solder balls and intercoupling component 16 to connect the QFP 10 to the printed circuit board 20 can also provide the advantage of increased mechanical stability. The leads 12 on the QFP 10 are formed of a metal or conductive material and can be bent with the application of too large of a force onto the QFP 10. If QFP 10 is connected directly to the circuit board 20 and the leads 12 of the QFP 10 become bent during application, the leads 12 may fail to form an electrical contact with the circuit board 20. In contrast, when using intercoupling component 16, the QFP 10 can be pre-attached to the intercoupling component 16 which is then attached to the printed circuit board using the solder balls 32 disposed on the lower surface 26 of the intercoupling component 16. The solder balls 32 are generally more robust to the application of force in comparison to the leads 12 of the QFP 10. As such, the amount of force used to connect the intercoupling component 16 to the printed circuit board 20 is less likely to result in the loss of an electrical connection between the QFP 10 and the printed circuit board 20.

The use of multiple solder balls and intercoupling component 16 to connect the QFP 10 to the printed circuit board 20 can also provide the advantage of increased electrical contact area.

A number of embodiments of the invention have been described. Nevertheless, it will be understood that various modifications may be made without departing from the spirit and scope of the invention.

For example, the intercoupling component can be used with various types of quad flat packages such as a bumpered quad flat package (BQFP), a bumpered quad flat package with heat spreader (BQFPH), ceramic quad flat package (CQFP), a fine pitch quad flat package (FQFP), a heat sinked quad flat package (HQFP), a low profile quad flat package (LQFP), a metric quad flat package (MQFP), a plastic quad flat package (PQFP), a small quad flat package (SQFP), a thin quad flat package (TQFP), a very small quad flat package (VQFP), and/or a very thin quad flat package (VTQFP). In addition, while the above examples are described in terms of a quad flat package (QFP), a similar intercoupling component could be used for other types of packages. For example, a similar intercoupling component could be used for a ball grid array package (BGA), a quad flat package no leads (micro lead frame) (QFN(MLF)), a small outline integrated circuit package (SOIC), and/or a plastic leaded chip carrier (PLCC).

In another example, while the above examples shows a set of three solder balls 32 forming the connection between the intercoupling component 16 and the printed circuit board 20, other numbers of solder balls 32 could be used. For example, a set of 4, 5, 6, 7, 8, 9, or 10 solder balls 32 could be used to form each connection region between the intercoupling component 16 and a surface pad 22 on the printed circuit board 20. In general, the number of solder balls used to form the connection region can be selected based on the size and shape of the leads on the QFP and the diameter of the solder balls such that the arrangement of the solder balls corresponds to the layout of the leads of the QFP. If the solder balls are smaller, more solder balls may be used to form the connection region. In addition, if the leads of the QFP are very closely spaced, it may be desirable to closely control the flow of solder by using more, smaller sized solder balls arranged to limit the flow in undesired directions.

In another example, while the solder balls in at least some of the examples shown above are arranged in a linear arrangement, other arrangements are possible. For example, multiple rows of solder balls could be arranged side by side to form a rectangular contact region.

Other embodiments are within the scope of the following claims.

What is claimed is:

1. An intercoupling component of the type used to electrically connect device leads of an integrated circuit package to a substrate, the package having a body and each device lead having a downwardly extending section proximate a side of the body, the intercoupling component comprising:
    an insulating support member having:
        a first surface including first electrical attachment sites, each configured for making an electrical connection with a corresponding one of the device leads of the integrated circuit package,
        an opposite second surface including second electrical attachment sites in electrical contact with the first electrical attachment sites, each of the second electrical attachment sites including a plurality of solder balls associated with each device lead.

2. The intercoupling component of claim 1, wherein the integrated circuit package is a quad flat pack type package.

3. The intercoupling component of claim 1, wherein the first electrical attachment sites are electrically connected to the second electrical attachment sites by via holes.

4. The intercoupling component of claim 1, wherein the plurality of solder balls comprises at least three solder balls.

5. The intercoupling component of claim 1, wherein the plurality of solder balls comprises at least five solder balls.

6. The intercoupling component of claim 1, wherein each of the plurality of solder balls has a diameter of at most about 0.014 inches.

7. The intercoupling component of claim 1, wherein the plurality of solder balls comprises at least three solder balls arranged in conformity with the shape of conductive pads on the substrate.

8. The intercoupling component of claim 7 wherein the plurality of solder balls are arranged linearly.

9. The intercoupling component of claim 1, wherein
    the downwardly extending section of each device lead is connected at one end to the package body, and at another end has a portion bent to form an elongate foot,
    the plurality of solder balls comprises at least three solder balls arranged in conformity with the shape of conductive pads on the substrate.

10. The intercoupling component of claim 9 wherein the plurality of solder balls are arranged linearly.

11. The intercoupling component of claim 1 wherein each of the plurality of solder balls has a diameter in the range of 0.012 inches to 0.014 inches.

12. An intercoupling component of the type used to electrically connect device leads of an integrated circuit package to a substrate, the package having a body and each device lead having a downwardly extending section extending from a side of the body, the intercoupling component comprising:
    an insulating support member having:
        a first surface including first electrical attachment sites, each configured for making an electrical connection with a corresponding one of the device leads of the integrated circuit package,
        an opposite second surface including second electrical attachment sites in electrical contact with the first electrical attachment sites, each of the second electrical attachment sites including a plurality of solder balls arranged in correspondence with a shape of each device lead.

13. The intercoupling component of claim 12 wherein each of the plurality of solder balls has a diameter in the range of 0.012 inches to 0.014 inches.

14. A method of electrically intercoupling an integrated circuit package to a circuit board using an intercoupling component,
    the package having a body and plural device leads, each device lead having a downwardly extending section extending from a side of the body,
    the circuit board comprising first electrical attachment sites, wherein the method comprises the following steps:
    providing the intercoupling component, the intercoupling component comprising an insulating support member having:
        one surface including second electrical attachment sites, each configured for making an electrical connection with a corresponding one of the device leads, and
        another surface disposed opposite to the one surface, the another surface including third electrical attachment sites in electrical contact with the second electrical attachment sites,
    providing plural solder balls on each of the third electrical attachment sites;
    providing solder paste on each of the second electrical attachment sites;
    positioning the package with respect to the intercoupling component such that the device leads are disposed on corresponding second electrical attachment sides in contact with the solder paste;
    positioning the intercoupling component with respect to the circuit board such that the plural solder balls on each of the third electrical attachment sites are disposed on a single corresponding first attachment site,
    reflowing the assembled package, intercoupling component, and circuit board.

15. The method of claim 14 wherein each of the plural solder balls has a diameter in the range of 0.012 inches to 0.014 inches.

\* \* \* \* \*